United States Patent
Gronski et al.

(10) Patent No.: US 12,431,330 B2
(45) Date of Patent: Sep. 30, 2025

(54) HELICAL VOLTAGE STANDOFF

(71) Applicant: Applied Materials, Inc., Santa Clara, CA (US)

(72) Inventors: Diana C. Gronski, Salisbury, MA (US); Alicia Chen, Malden, MA (US); Craig R. Chaney, Gloucester, MA (US); Adam M. McLaughlin, Merrimac, MA (US)

(73) Assignee: Applied Materials, Inc., Santa Clara, CA (US)

( * ) Notice: Subject to any disclaimer, the term of this patent is extended or adjusted under 35 U.S.C. 154(b) by 593 days.

(21) Appl. No.: 17/957,095

(22) Filed: Sep. 30, 2022

(65) Prior Publication Data

US 2024/0112883 A1  Apr. 4, 2024

(51) Int. Cl.
*H01J 37/317* (2006.01)
*H01L 21/265* (2006.01)

(52) U.S. Cl.
CPC .... *H01J 37/3171* (2013.01); *H01L 21/26513* (2013.01); *H01J 2237/31701* (2013.01)

(58) Field of Classification Search
None
See application file for complete search history.

(56) References Cited

U.S. PATENT DOCUMENTS

| | | | |
|---|---|---|---|
| 4,634,806 A * | 1/1987 | Haag | B03C 3/70 96/88 |
| 5,703,372 A | 12/1997 | Horsky et al. | |
| 7,804,076 B2 | 9/2010 | Huang et al. | |
| 9,711,318 B2 | 7/2017 | White | |
| 10,074,508 B2 * | 9/2018 | Baggett | H01J 37/08 |
| 2004/0188631 A1 | 9/2004 | Horsky et al. | |
| 2004/0256578 A1 | 12/2004 | Mitchell et al. | |
| 2007/0262270 A1 | 11/2007 | Huang et al. | |
| 2009/0236547 A1 | 9/2009 | Huang et al. | |
| 2012/0058252 A1 | 3/2012 | Sweeney et al. | |
| 2014/0103017 A1 | 4/2014 | Ashtekar et al. | |
| 2018/0209035 A1 | 7/2018 | Liu et al. | |
| 2018/0350553 A1 * | 12/2018 | Baggett | H01J 37/3171 |

(Continued)

FOREIGN PATENT DOCUMENTS

| | | |
|---|---|---|
| CN | 207139151 U | 3/2018 |
| CN | 213845219 U | 7/2021 |

(Continued)

OTHER PUBLICATIONS

International Search Report and Written Opinion mailed Feb. 7, 2024 in co-pending PCT application No. PCT/US2023/035396.

(Continued)

*Primary Examiner* — Andrew Smyth
(74) *Attorney, Agent, or Firm* — Nields, Lemack & Frame, LLC

(57) ABSTRACT

An insulator that has a helical protrusion spiraling around the shaft is disclosed. A lip is disposed on the distal end of the helical protrusion, creating regions on the shaft that are shielded from material deposition by the lip. By proper sizing of the threads, the helical protrusion and the lip, the line-of-sight to the interior wall of the shaft can be greatly reduced. This results in longer times before failure. This insulator may be used in an ion implantation system to physically and electrically separate two components.

19 Claims, 10 Drawing Sheets

(56) References Cited

U.S. PATENT DOCUMENTS

| | | |
|---|---|---|
| 2020/0163709 A1 | 5/2020 | Ostroot et al. |
| 2020/0211809 A1 | 7/2020 | Yen et al. |
| 2022/0154328 A1 | 5/2022 | Ishida |
| 2022/0301808 A1 | 9/2022 | Ochi |
| 2024/0177960 A1 | 5/2024 | McLaughlin et al. |

FOREIGN PATENT DOCUMENTS

| | | | | |
|---|---|---|---|---|
| EP | 3813082 A1 | | 4/2021 | |
| JP | 2018533184 A | * | 11/2018 | ............. H01J 37/08 |
| JP | 2022-81201 A | | 5/2022 | |
| KR | 2008-0051862 A | | 6/2008 | |
| KR | 20180081483 A | * | 7/2018 | ............. H01J 37/08 |
| TW | 373209 B | | 11/1999 | |
| TW | 521295 B | | 2/2003 | |
| TW | 201535453 A | | 9/2015 | |
| WO | 2020/123061 A1 | | 6/2020 | |

OTHER PUBLICATIONS

International Search Report and Written Opinion mailed Dec. 11, 2023 in corresponding PCT application No. PCT/US2023/030707.

* cited by examiner

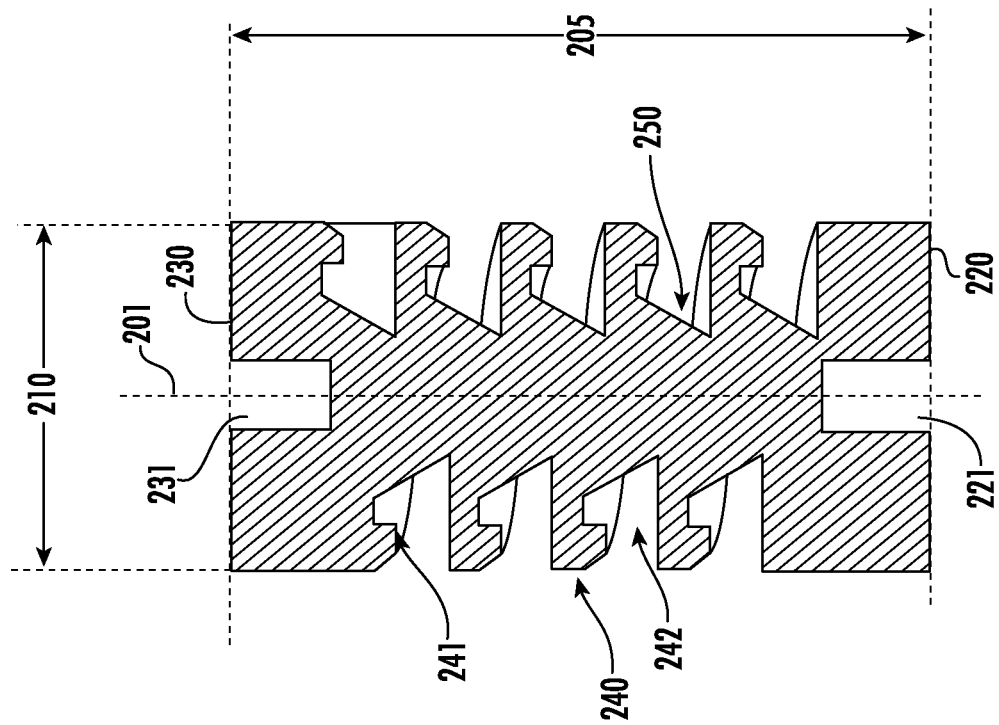
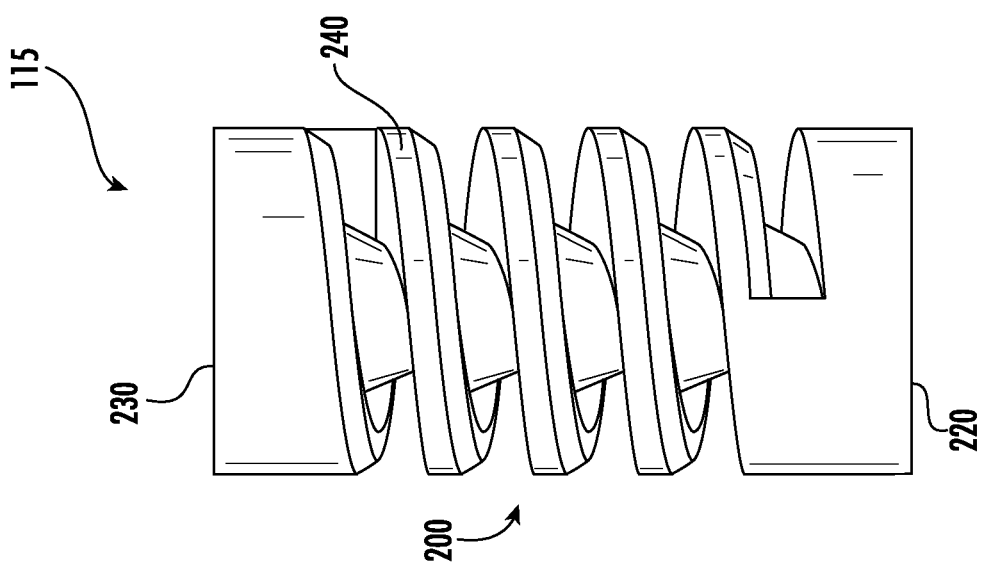
FIG. 2B
FIG. 2A

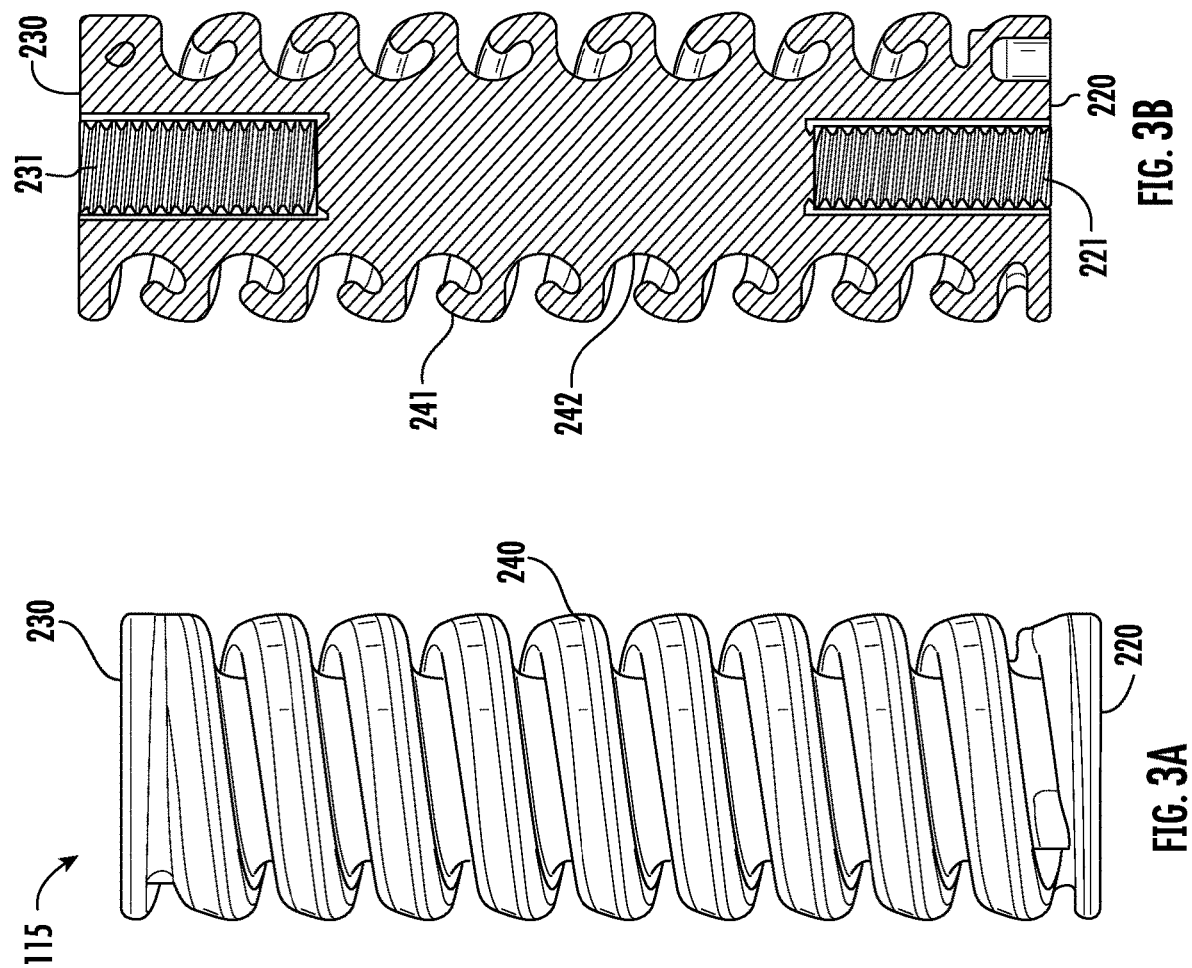

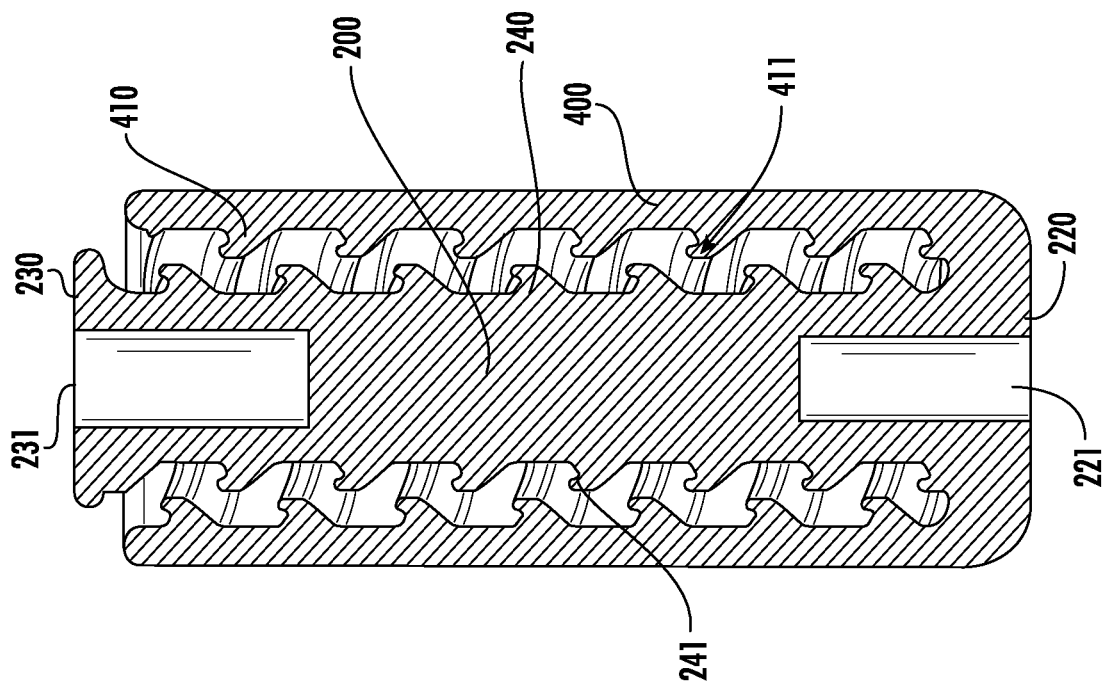
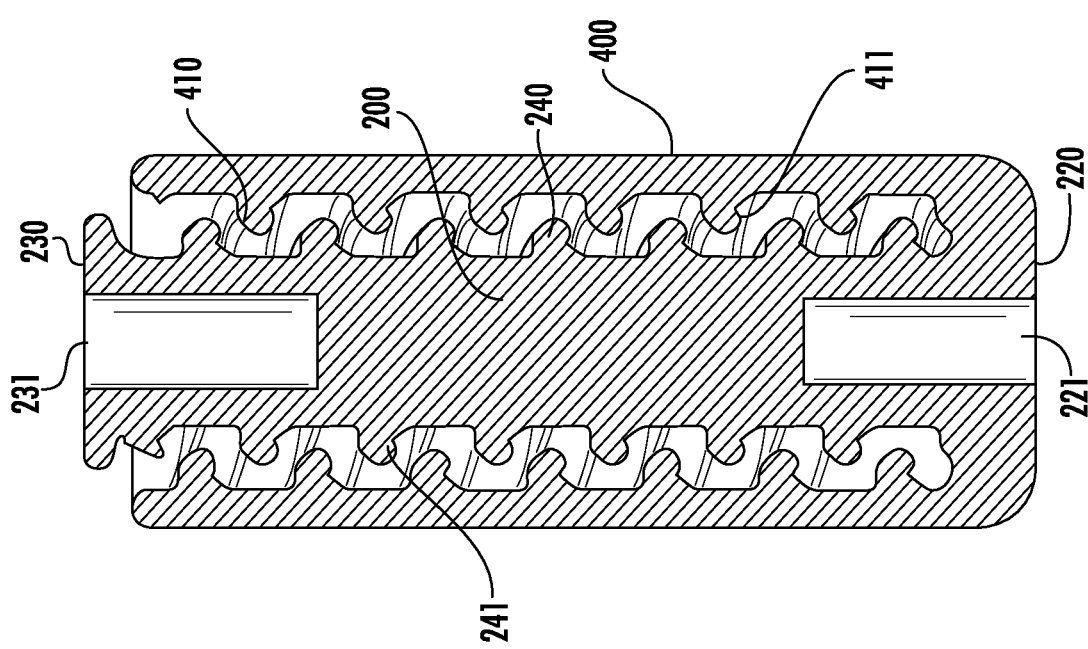

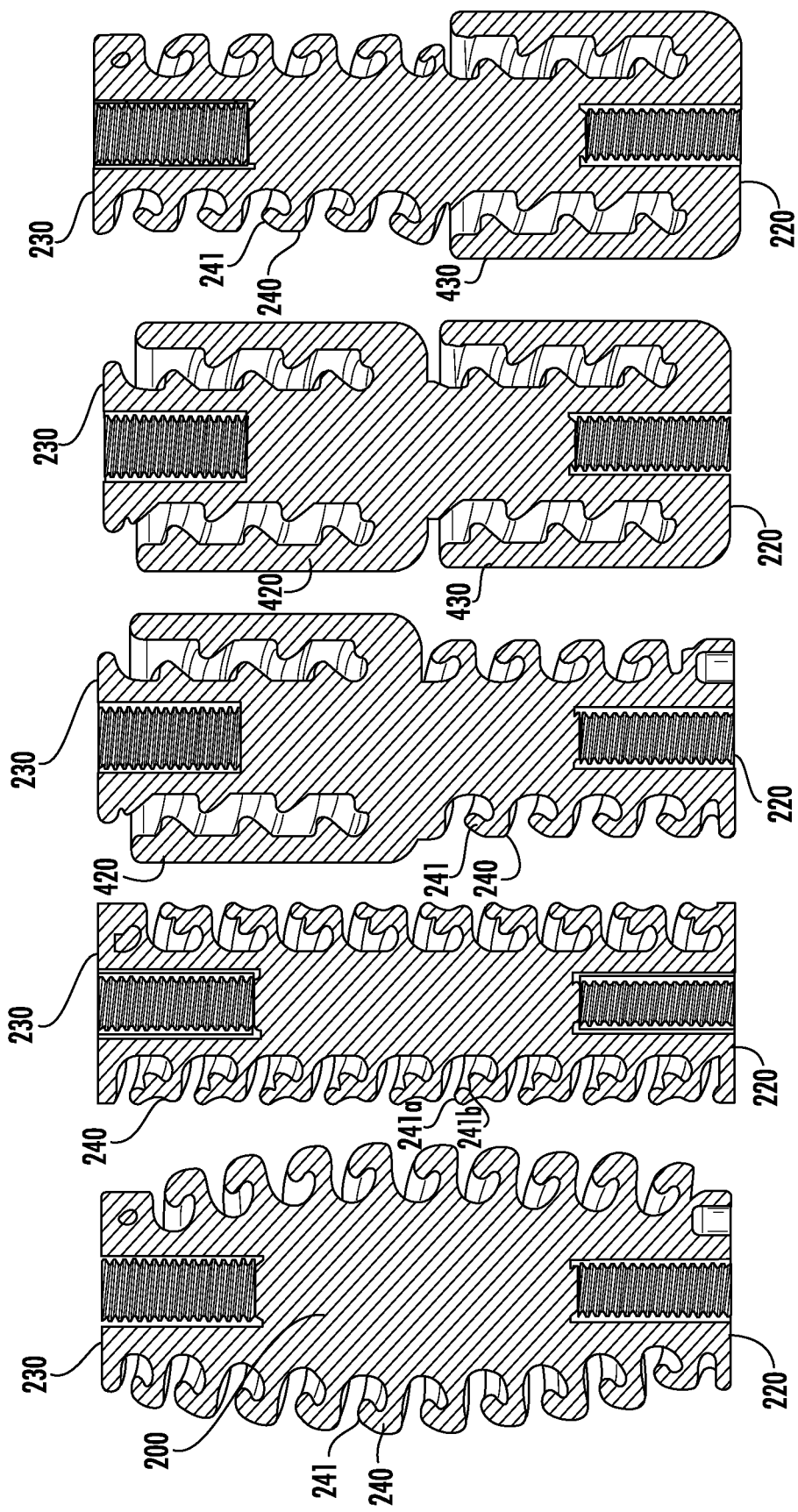

HELICAL VOLTAGE STANDOFF

FIELD

Embodiments of the present disclosure relate to an insulator, and more particularly a helical insulator for use in an ion implantation system.

BACKGROUND

Ion implantation is a common technique to introduce impurities into a workpiece to affect the conductivity of portions of that workpiece. For example, ions that contain elements in Group III, such as boron, aluminum and gallium, may be used to create P-type regions in a silicon workpiece. Ions that contain elements in Group V, such as phosphorus and arsenic, may be used to create N-type regions in the silicon workpiece. Of course, other species may also be used.

In some ion implantation systems, ions are generated in an ion source and are extracted through an extraction aperture. In some embodiments, one or more electrodes, which are electrically biased, are located outside the ion source, proximate the extraction aperture. The voltage applied to one of these electrodes serves to attract ions from within the ion source such that the ions exit the ion source through the extraction aperture.

Insulators are located between the ion source and each of the electrodes to maintain different voltages on each of these components. Additionally, insulators may be located in other locations, such as between conductive rods in an energy purity module (EPM), as feet for various sections or the system and other locations. Thus, the placement of the insulators is not limited. However, over time, deposition, which is caused by the material that is extracted from the ion source, begins to coat the insulators. Over time, the coating on the insulator may be sufficiently thick such that an electrical path forms along the exterior edge of the insulator. This may cause two of these components to be electrically shorted. In this scenario, the ion implantation system is taken off line so that the insulator can be cleaned or replaced. This reduces throughput and hurts efficiency.

Therefore, it would be advantageous if there were an insulator that could be used in an ion implantation system that was more resistant to these electrical shorts.

SUMMARY

An insulator that has a helical protrusion spiraling around the shaft is disclosed. A lip is disposed on the distal end of the helical protrusion, creating regions on the shaft that are shielded from material deposition by the lip. By proper sizing of the threads, the helical protrusion and the lip, the line-of-sight to the interior wall of the shaft can be greatly reduced. This results in longer times before failure. This insulator may be used in an ion implantation system to physically and electrically separate two components.

According to one embodiment, an insulator is disclosed. The insulator comprises a shaft having a first end and a second end; and a helical protrusion spiraling around the shaft, wherein the helical protrusion comprises a lip disposed at its distal end extending toward the second end. In some embodiments, the helical protrusion extends from the first end to the second end. In some embodiments, the helical protrusion extends from the first end toward the second end. In certain embodiments, an indentation is disposed between the helical protrusion and the second end. In certain embodiments, an indentation is disposed between the first end and the helical protrusion and between the second end and the helical protrusion. In some embodiments, a helical recess is disposed between adjacent threads of the helical protrusion, and wherein a portion of the helical recess is shielded by the lip. In some embodiments, pitch is defined as a distance between two adjacent threads of the helical protrusion, and the pitch comprises two portions, a total lip height defined as a distance from a bottom of a thread of the helical protrusion to a top of the lip, and an open height defined as a distance from the top of the lip to a bottom of an adjacent thread, and a ratio of the total lip height to the open height is between 0.75 and 10. In certain embodiments, wherein the ratio of the total lip height to the open height is between 2.5 and 10. In some embodiments, the open height is between 0.02 and 0.5 inches. In some embodiments, a width of the shaft varies over its length.

According to another embodiment, an ion implantation system is disclosed. The ion implantation system comprises an ion source; at least two electrodes disposed outside the ion source; and the insulator described above, disposed between the at least two electrodes to physically and electrically separate the at least two electrodes from each other.

According to a third embodiment, an insulator is disclosed. The insulator comprises a shaft having a first end and a second end; a helical protrusion spiraling around the shaft; and a sheath extending outward from the shaft and surrounding a portion of the shaft, wherein a sheath helical protrusion is disposed on an interior surface of the sheath facing the shaft; wherein at least one of the helical protrusion or the sheath helical protrusion comprises a lip disposed at its distal end. In some embodiments, the lip extends toward an opening between the sheath and the shaft. In some embodiments, the lip extends away from an opening between the sheath and the shaft. In certain embodiments, a lip is disposed on both the helical protrusion and the sheath helical protrusion. In some embodiments, the lip disposed on the helical protrusion and the lip disposed on the sheath helical protrusion extend in a same direction. In some embodiments, the insulator comprises a second sheath extending outward from the shaft and covering a second portion of the shaft.

According to another embodiment, an ion implantation system is disclosed. The ion implantation system comprises an ion source; at least two electrodes disposed outside the ion source; and the insulator described above, disposed between the at least two electrodes to physically and electrically separate the at least two electrodes from each other.

BRIEF DESCRIPTION OF THE FIGURES

For a better understanding of the present disclosure, reference is made to the accompanying drawings, which are incorporated herein by reference and in which:

FIGS. 2A-2B show the insulator according to one embodiment;

FIGS. 3A-3C show the insulator according to a second embodiment;

FIGS. 4A-4D show the insulator according to a third embodiment;

FIGS. 5A-5E show other embodiments of the insulator;

DETAILED DESCRIPTION

Figure 1:
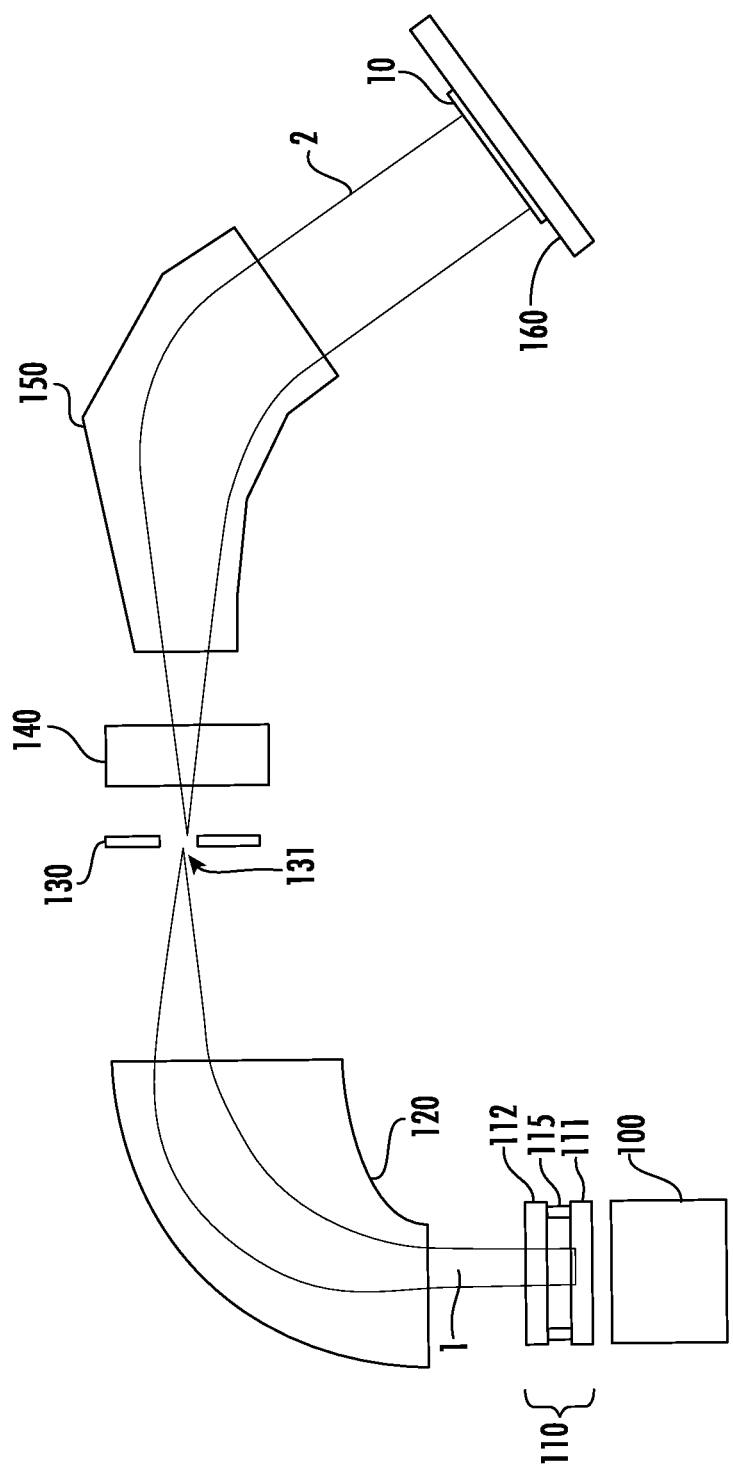
FIG. 1 is an ion implanter that utilizes the insulator according to one embodiment.

FIG. 1 shows an ion implantation system that may be used for implanting ions into a workpiece using an ion beam according to one embodiment.

The ion implantation system includes an ion source 100 comprising a plurality of chamber walls defining an ion source chamber. In certain embodiments, the ion source 100 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed.

In another embodiment, a cathode is disposed within the ion source chamber. A filament is disposed behind the cathode and energized so as to emit electrons. These electrons are attracted to the cathode, which in turn emits electrons into the ion source chamber. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 1 generated in the ion source chamber are extracted and directed toward a workpiece 10. The extraction aperture may be any suitable shape. In certain embodiments, the extraction aperture may be oval or rectangular shaped.

Disposed outside and proximate the extraction aperture of the ion source 100 are extraction optics 110. In certain embodiments, the extraction optics 110 comprise one or more electrodes. In certain embodiments, the extraction optics 110 comprises a suppression electrode 111, which is negatively biased relative to the plasma so as to attract ions through the extraction aperture. The suppression electrode 111 may be electrically biased using a suppression power supply (not shown). The suppression electrode 111 may be biased so as to be more negative than the extraction plate of the ion source 100. In certain embodiments, the suppression electrode 111 is negatively biased by the suppression power supply, such as at a voltage of between −3 kV and −15 kV.

In some embodiments, the extraction optics 110 includes a ground electrode 112. The ground electrode 112 may be disposed proximate the suppression electrode 111. The ground electrode 112 may be electrically connected to ground. Of course, in other embodiments, the ground electrode 112 may be biased using a separate power supply.

In other embodiments, the extraction optics 110 may comprise in excess of two electrodes, such as three electrodes or four electrodes. In these embodiments, the electrodes may be functionally and structurally similar to those described above, but may be biased at different voltages.

Each electrode in the extraction optics 110 may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an electrode power supply. The electrode power supply may be used to bias one or more of the electrodes relative to the ion source so as to attract ions through the extraction aperture. The extraction aperture and the apertures in the extraction optics 110 are aligned such that the ions 1 pass through apertures.

The electrodes in the extraction optics 110 may be separated, both physically and electrically, through the use of one or more insulators 115. Further, in some embodiments, insulators 115 are also used to separate the ion source 100 from the suppression electrode 111.

Located downstream from the extraction optics 110 is a mass analyzer 120. The mass analyzer 120 uses magnetic fields to guide the path of the extracted ions 1. The magnetic fields affect the flight path of ions according to their mass and charge. A mass resolving device 130 that has a resolving aperture 131 is disposed at the output, or distal end, of the mass analyzer 120. By proper selection of the magnetic fields, only those ions 1 that have a selected mass and charge will be directed through the resolving aperture 131. Other ions will strike the mass resolving device 130 or a wall of the mass analyzer 120 and will not travel any further in the system.

A collimator 140 may be disposed downstream from the mass resolving device 130. The collimator 140 accepts the extracted ions 1 that pass through the resolving aperture 131 and creates a ribbon ion beam formed of a plurality of parallel or nearly parallel beamlets.

Located downstream from the collimator 140 may be an acceleration/deceleration stage 150. The acceleration/deceleration stage 150 may be referred to as an energy purity module (EPM). The energy purity module is a beam-line lens component configured to independently control deflection, deceleration, and focus of the ion beam. For example, the energy purity module may be a vertical electrostatic energy filter (VEEF) or electrostatic filter (EF). Located downstream from the acceleration/deceleration stage 150 is the movable workpiece holder 160.

In some embodiments, one or more lenses may be disposed along the beam line. A lens may be disposed before the mass analyzer 120, after the mass analyzer 120, before the collimator 140 or another suitable location.

The workpiece 10 is disposed on a movable workpiece holder 160.

In certain embodiments, the forward direction of the ion beam is referred to as the Z-direction, the direction perpendicular to this direction and horizontal may be referred to as the first direction or the X-direction, while the direction perpendicular to the Z-direction and vertical may be referred to as the second direction or Y-direction.

Thus, in operation, the movable workpiece holder 160 moves in the second direction from a first position, which may be above the ion beam 2 to a second position, which may be below the ion beam 2. The movable workpiece holder 160 then moves from the second position back to the first position. The ion beam 2 is wider than the workpiece 10 in the first direction, ensuring that the entirety of the workpiece 10 is exposed to the ion beam 2.

In certain embodiments, sensors are used to monitor the ion beam. For example, Faraday cups may be used to measure the beam current at or near the workpiece. Other beam monitoring devices may also be employed. These other beam monitoring devices may include multipixel profilers, dose cups, and set up cups.

In addition to the use of insulators between the electrodes in the extraction optics, insulators 115 may also be used in conjunction with electrical feedthroughs, Faraday sensors, electrostatic cups, lenses and high voltage stacks. For example, insulators may be disposed in the acceleration/deceleration stage 150 to provide electrical feedthroughs for the rods in the EPM.

In other embodiments, the insulators may be used as electrical feedthroughs to supply voltage through the chamber walls of the ion source 100.

In some embodiments, an insulator is used to isolate the one or more lenses from ground. In other embodiments, an insulator may be used to isolate the Faraday cups or beam monitoring devices from ground.

Of course, any component that is maintained at a voltage that is different from the voltage of surrounding components (or from ground) may be isolated using the insulator described herein.

In some embodiments, some of the ions or other material that are extracted from the ion source 100 may be deposited on the insulators 115. This material may be electrically conductive, such that over time, a conductive path may form on the exterior surface of the insulator, causing the suppression electrode 111 to electrically short to the ion source 100 or the ground electrode 112.

FIGS. 2A-2B show a first embodiment of an insulator 115 that is resistant to the formation of this conductive path. FIG. 2B shows a cross-sectional view of the insulator 115 of FIG. 2A. The insulator 115 has a height 205, which may be determined by the configuration of the ion implantation system. For example, insulators that are used for the extraction optics 110 may have a height 205 of between 1 and 3 inches and a width 210 of between 0.5 and 1 inches. Other insulators, such as those used to isolate other components, may have a height 205 of, for example, between 1 and 12 inches and a width 210, which may be, for example, between 1 and 24 inches, although other dimensions are also possible. In certain embodiments, the shaft 200 of the insulator may be cylindrical such that the width 210 is also the diameter of the insulator 115. However, in other embodiments, the shaft 200 of the insulator may be an oval cylinder, an elliptical cylinder, a cuboid or any other suitable shape. The shaft 200 of the insulator 115 has a first end 220 and a second end 230. In some embodiments, the first end 220 has an interior threaded channel 221, which may be disposed along the central axis 201 of the shaft 200. Likewise, an interior threaded channel 231 may be disposed on the second end 230. These interior threaded channels allow screws to be inserted so as to secure the insulator 115 in position. For example, screws may be used to secure the insulator 115 between the suppression electrode 111 and the ground electrode 112.

The shaft 200 of the insulator 115 has a helical recess 242 that spirals from the second end 230 to the first end 220. The interior wall 250 of the helical recess 242 may be the part of the shaft 200 having the smallest width. The portions of the shaft 200 that are not recessed may retain the same width as the first end 220 or the second end 230. These portions of the shaft 200 that are not recessed may be referred to as the helical protrusion 240. The helical protrusion 240 extends radially outward from the recessed regions. Thus, helical recess 242 and helical protrusion 240 are used to denote parts of the shaft 200 that have two different widths or diameters. In some embodiments, there is a single helical protrusion 240 that spirals from the first end 220 to the second end 230. However, in other embodiments, additional helical protrusions 240 may be present. Although the helical protrusion 240 is continuous, throughout this disclosure, the term "thread" is used to describe a specific protrusion.

Figure 7C:
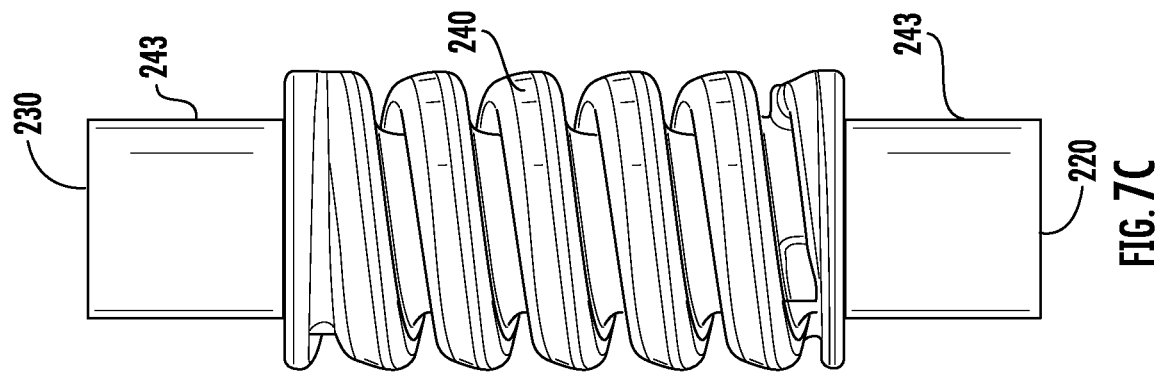
FIGS. 7A-7C show the insulator according to other embodiments.
Figure 7B:
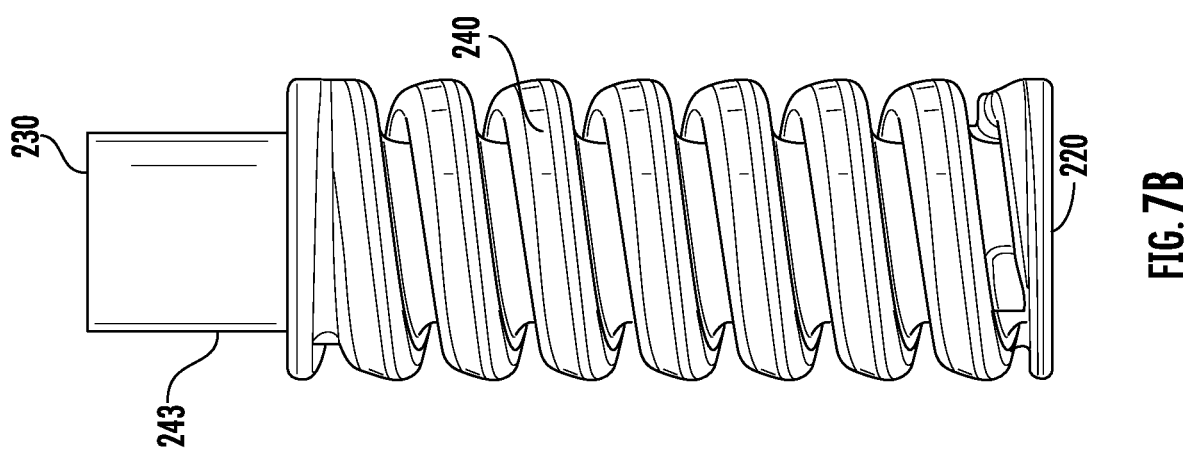
Figure 7A:
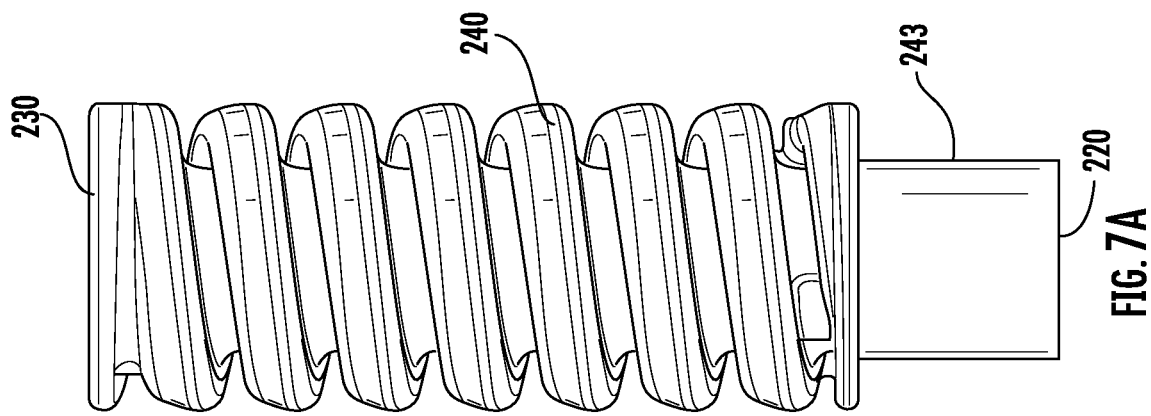

While the above description discloses that the helical protrusion 240 extends from the first end 220 to the second end 230, other embodiments, which are shown in FIGS. 7A-7C, are also possible. For example, the helical protrusion 240 may be separated from the first end 220, as shown in FIG. 7A, the second end 230 as shown in FIG. 7B, or both ends as shown in FIG. 7C. As shown in FIG. 7C, the helical protrusion 240 may cover between 20% and 75% of the shaft 200.

Additionally, in embodiments where the helical protrusion 240 does not extend to one end or both ends, there may be an indentation 243 in the shaft 200 that separates the helical protrusion 240 and the helical recess 242 from that end. In some embodiments, the indentation 243 has a width or diameter equal to that of the interior wall 250. In other embodiments, the width of the indentation 243 may be larger or smaller than the width or diameter of the interior wall 250.

In embodiments where the helical protrusion 240 does not extend to the second end 230, the helical protrusion 240 extends from the first end 220 toward the second end 230.

In all of these embodiments, the helical protrusion 240 extends from a first position at or near the first end 220 to a second position at or near the second end 230. As described above, the first position may be at the first end 220 or a distance of between 5% and 25% of the length of the shaft 200 from the first end 220. Similarly, the second position may be at the second end 230 or a distance of between 5% and 25% of the length of the shaft 200 from the second end 230.

The helical protrusion 240 has a proximal end, which abuts the shaft 200 and a distal end opposite the proximal end. The distal end of the helical protrusion 240 may have a lip 241 that extends in a direction that is not radial and is toward the second end 230. As described in more detail below, the lip 241 creates shielded regions in the helical recess 242 that do not have line-of-sight to the ion source 100 or the extracted ions.

Figure 3C:
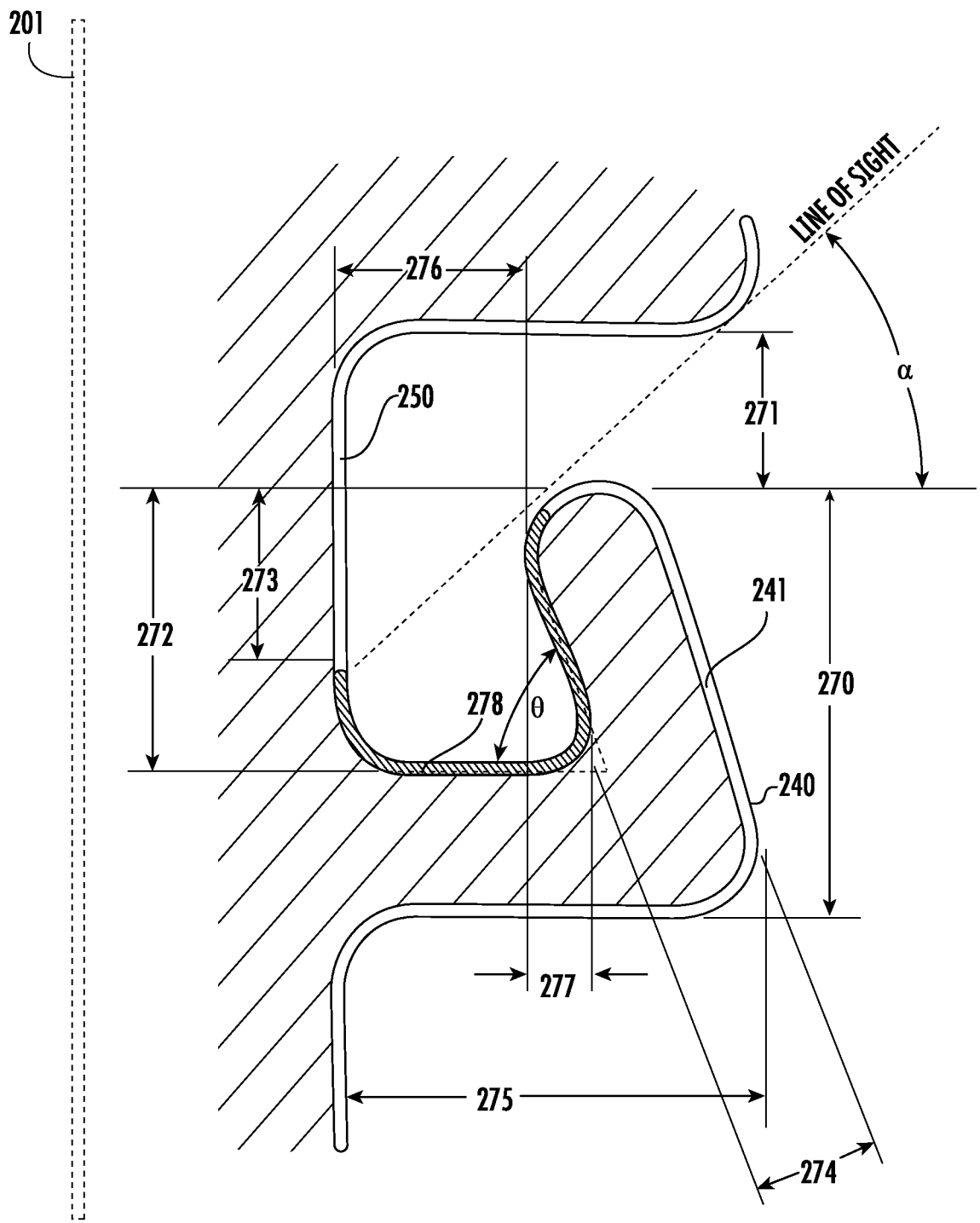

FIGS. 3A-3C show another embodiment of the insulator 115. FIG. 3B shows a cross-sectional view of the insulator 115 of FIG. 3A, while FIG. 3C is an expanded view of the helical protrusion. As described above, in some embodiments, the first end 220 has an interior threaded channel 221, which may be disposed along the central axis 201 of the shaft 200. Likewise, an interior threaded channel 231 may be disposed on the second end 230. These interior threaded channels allow screws to be inserted so as to secure the insulator 115 in position. In this embodiment, the insulator is constructed with more rounded edges than appeared in FIGS. 2A-2B. Specifically, the location where the helical protrusion 240 meets the helical recess 242 is rounded, rather than a sharp angle. Similarly, the location where the helical protrusion 240 meets the lip 241 is also rounded, rather than a sharp angle.

FIG. 3C shows many parameters associated with the helical protrusion 240, the lip 241 and the helical recess 242. Further, in this embodiment, the lip 241 extends further toward the second end 230. An increase in the height of the lip 241 may result in a larger pitch and a smaller number of threads. Conversely, a smaller lip 241 allows for smaller pitch and a greater number of threads per inch.

First, as best shown in FIG. 3C, the pitch of the helical protrusion 240, which is defined as the distance from the bottom edge of one thread of the helical protrusion 240 to the bottom edge of the directly adjacent thread of the helical protrusion 240, may be between 0.035 and 5.5 inches, although other values may be used. For example, in some embodiments, the pitch may be between 0.5 inches and 1.5 inches. That pitch is divided into two portions, the first portion, or total lip height 270, is the region from the bottom edge of the helical protrusion 240 to the top of the lip 241, while the second portion, or open height 271, is the distance from the top of the lip 241 to the bottom edge of the adjacent helical protrusion 240.

The lip height 272 is defined as the distance from the top edge of the helical protrusion 240 to the top of the lip 241. The total lip height 270 is equal to the lip height 272 plus the thickness of the helical protrusion 240. The helical protrusion 240 may have a thickness of between 0.02 and 1.0 inches, although other dimensions may be used. The thickness is defined as the dimension of the helical protrusion 240 that is parallel to the central axis 201 of the shaft 200.

The open height 271 helps define the range of angles that have a line-of-sight to the interior wall 250. In some embodiments, the open height 271 may be between 0.02 inches and 0.5 inches, although other dimensions may be used.

The maximum angle at which material still reaches the interior wall 250 is referred to as α. Looking at FIG. 3C, it can be seen that angle α can be roughly defined as the arc tangent of open height 271 divided by the distance from the top of the lip 241 to the outer edge of the helical protrusion 240. This can roughly be expressed as arctan(open height 271/(protrusion distance 275–separation distance 276)). Alternatively, it may be approximated as the arctan (open height 271/lip thickness 274). The maximum angle α is less than 90° and is preferably as small as possible. In some embodiments, the maximum angle α may be between 7° and 35°. In other embodiments, the maximum α may be less than 20°. A smaller open height 271 reduces the maximum line-of-sight angle, but also brings the lip 241 in closer proximity to the adjacent bottom edge of the helical protrusion 240. In some embodiments, the ratio of the total lip height 270 to the open height 271 may be as small as 0.75. In some embodiments, the ratio of the total lip height 270 to the open height 271 may be as large as 10. The portion of the interior wall 250 that is exposed to the line-of-sight includes the underside or bottom edge of the helical protrusion 240, and the interior wall that is between the bottom edge of the helical protrusion 240 and aligned to the top of the lip 241. Further, there is an exposed portion 273 of the interior wall 250 that is below the height of the top of the lip 241 that is also exposed. The length of the exposed portion 273 is determined based in part on the maximum angle of the line-of-sight, α.

The helical protrusion 240 extends outward from the interior wall 250 by a protrusion distance 275, which may be between 0.1 and 1.25 inches. The lip 241 has a lip thickness 274 that may be between 0.02 inches and 0.30 inches, although other thickness are also possible. The lip 241 extends at an angle from the helical protrusion 240. The angle, θ, represents the angle formed between the top edge of the helical protrusion 240 and the inner edge of the lip 241. In some embodiments, this angle, θ, may be between 3° and 92°.

The separation distance 276 defines the distance from the innermost part of the lip 241 to the interior wall 250 of the helical recess 242. This separation distance 276 also helps define the size of the exposed portion 273. In other words, the greater the separation distance 276, the larger the exposed portion 273. In some embodiments, the separation distance 276 is related to the open height 271, such that the ratio of separation distance 276 to the open height 271 is between 0.12 and 1.0, although other ratios may also be used.

The angle, θ, and the lip height 272 determine the amount of overhang 277 that exists. Overhang 277 is defined as the portion of the upper surface of the helical protrusion 240 that is vertically beneath the lip 241. In this context, "vertically" refers to the direction of the central axis 201. For example, if the lip 241 is vertical, there is no overhang. In some embodiments, the ratio of the overhang 277 to the lip thickness 274 of the lip 241 is between 0.125 and 0.75, although other ratios are also possible.

Shielded surface 278, which is shown in crosshatch, represents that portion of the helical recess 242, the helical protrusion 240 and the lip 241 that is shielded by the lip 241 and is therefore not in the line-of-sight of the ion source 100. The shielded surface 278 is disposed in the region defined by the interior surface of the lip 241 and the upper surface of the helical protrusion 240. The shielded surface 278 may also extend upward along the interior wall 250 of the shaft 200, depending on the maximum angle α. The shielded surface 278 refers to any surface that is not directly visible from outside the insulator 115.

Figure 6B:
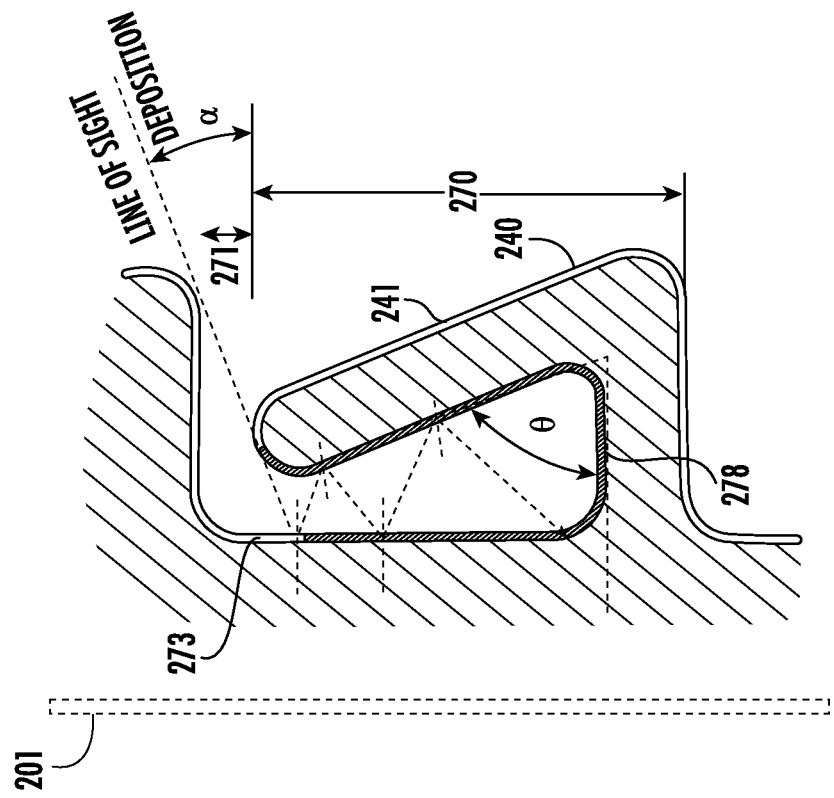
FIGS. 6A-6B show the effects of different lip heights on rebound deposition.
Figure 6A:
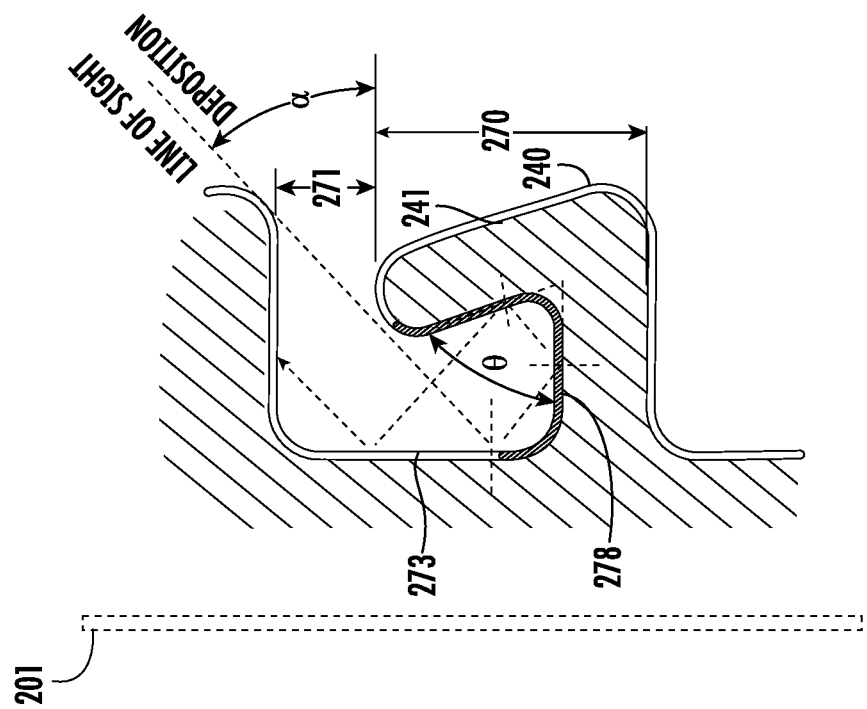

The dimensions described above also affect the amount of rebound deposition. Rebound deposition is defined as deposition that is caused by material that bounced or was deflected from another surface. For example, looking at FIG. 3C, rebound deposition may appear on the shielded surface 278 because of material that bounced from the exposed portion 273 of the interior wall 250. FIGS. 6A-6B show two different configurations which result in a different amount of rebound deposition.

In both configurations, the angle θ is kept constant. The difference is that the ratio of total lip height 270 to open height 271 is much greater in FIG. 6B. This larger ratio creates a much smaller line-of-sight angle α. This results in a much smaller exposed portion 273 of the interior wall 250 and a much larger shielded surface 278. In certain embodiments, the ratio of total lip height 270 to open height 271 may be 2.5 or greater. In certain embodiments, the ratio may be between 2.5 and 10. Furthermore, the smaller angle α also affects the angle at which material bounces from the exposed portion 273. Consequently, as shown in FIG. 6B, the amount of the shielded surface 278 that may be bombarded by rebound deposition is much smaller than that in FIG. 6A.

Figure 4A:
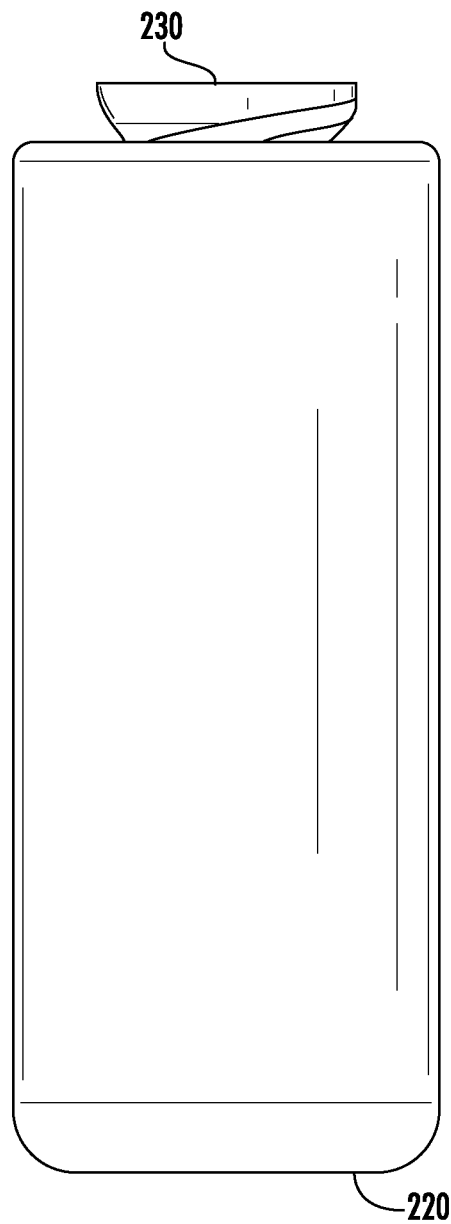
Figure 4B:
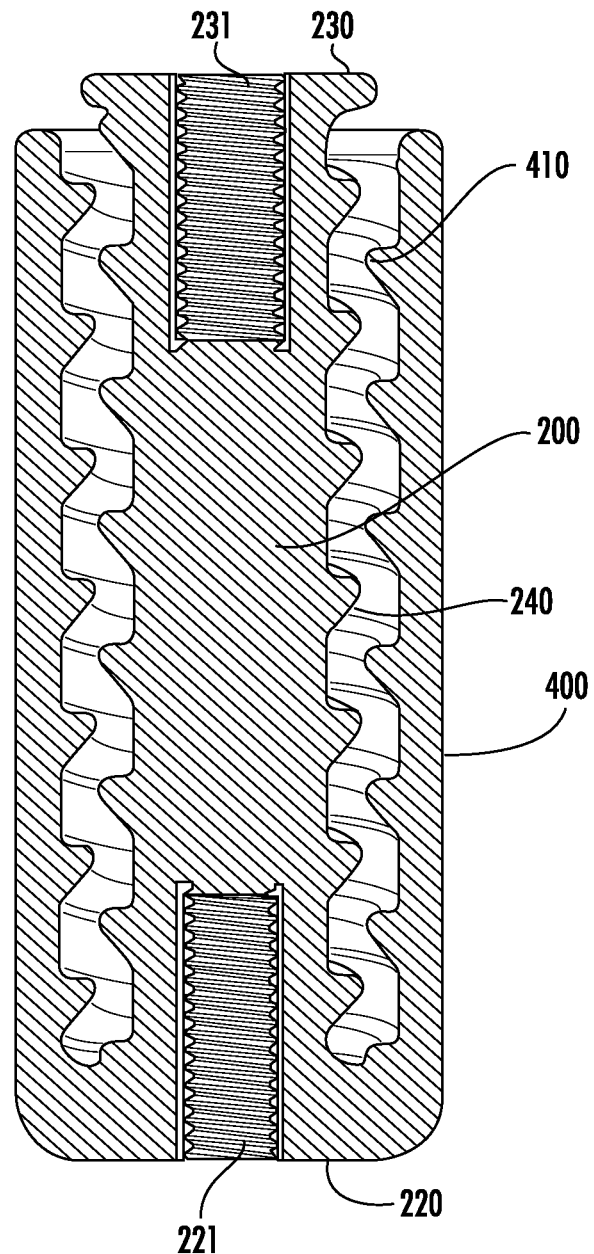

FIGS. 4A-4D shows other embodiments of the insulator. FIG. 4B shows a cross-sectional view of the insulator of FIG. 4A. As described above, in some embodiments, the first end 220 has an interior threaded channel 221, which may be disposed along the central axis 201 of the shaft 200. Likewise, an interior threaded channel 231 may be disposed on the second end 230. These interior threaded channels allow screws to be inserted so as to secure the insulator 115 in position.

In this embodiment, a sheath 400 is attached at the first end 220 of the shaft 200 and extends toward the second end 230, but does not contact the second end 230. Thus, the sheath 400 extends outward from the shaft 200 and surrounds a portion of the shaft 200. In embodiments where the shaft is cylindrical, the sheath may be cup-shaped. In some embodiments, the distance between the second end 230 and the end of the sheath 400 may be 0.04 to 0.5 inches. The shaft 200 has a helical protrusion 240.

The sheath 400 may have a thickness of 0.02 to 1.5 inches or more, although other dimensions are also possible. In some embodiments, such as that shown in FIG. 4B, the interior wall of the sheath 400 also includes a sheath helical protrusion 410. The sheath helical protrusion 410 extends toward the central axis 201 of the shaft 200. The sheath helical protrusion 410 may also include a sheath lip 411 as shown in FIGS. 4C-4D, which is similar to the lip 241 as shown in FIG. 3C. In other embodiments, the sheath lip 411 may be omitted.

In some embodiments, the pitch of the sheath helical protrusion 410 may be the same as that of the helical protrusion 240.

In certain embodiments, the protrusions of the shaft 200 and the sheath 400 are configured such that the threads of the helical protrusion 240 from the shaft 200 are disposed between two adjacent threads of the sheath helical protrusion 410 of the sheath 400.

While FIGS. 4A-4D show the sheath 400 as being cylindrical, it may have other shapes, such as an oval cylinder, an elliptical cylinder, a cuboid or any other suitable shape.

As described above, in some embodiments, the helical protrusion 240 extends from the first end 220 to the second end 230. In other embodiments, the helical protrusion 240 may be separated from at least one of the ends, similar to the separation shown in FIGS. 7A-7C.

In some embodiments where a sheath 400 is used, the helical protrusion 240 may include a lip 241, as described above. As shown in FIG. 4C, this lip 241 may extend downward, away from the opening between the sheath 400 and the shaft 200. In another embodiment, shown in FIG. 4D, this lip 241 may extend upward, toward the opening between the sheath 400 and the shaft 200. Thus, in some embodiments, the insulator comprises the shaft 200, helical protrusion 240 and lip 241 described with respect to FIGS. 2A-2B and 3A-3C, with the inclusion of a sheath 400.

In some embodiments, the sheath helical protrusion 410 may also have a sheath lip 411. The sheath lip 411 is similar to the lip 241, described above, but is disposed on the sheath helical protrusion 410, rather than the helical protrusion 240. In some embodiments, the sheath lip 411 extends in the same direction as the lip 241. Thus, in FIG. 4C, the sheath lip 411 extends downward away from the opening between the sheath 400 and the shaft 200. In FIG. 4D, the sheath lip 411 extends upward toward the opening between the sheath 400 and the shaft 200.

While FIGS. 4C-4D show a lip on both the helical protrusion 240 and the sheath helical protrusion 410, it is understood that in certain embodiments, only one of these helical protrusions has a lip. For example, there may be a sheath lip 411 and no lip 241 or a lip 241 and no sheath lip 411.

FIGS. 5A-5E show variations of the insulators. In all of these embodiments, the shaft 200 includes a helical protrusion spiraling from the first end to the second end. In addition, a lip 241 is extending from at least a portion of the helical protrusion 240 in each embodiment.

In FIG. 5A, the width of the shaft 200 is not uniform. Rather, the shaft 200 is thicker in the middle than near the first end 220 and the second end 230. In another embodiment (not shown), the shaft 200 may be thinner in the middle than near the first end and second end. In certain embodiments, the helical protrusion 240 changes protrusion distance 275 so that the outer width of the insulator remains constant. In other embodiments, the protrusion distance 275 may remain constant such that the outer width of the insulator varies.

FIG. 5B shows an insulator, where there are multiple lips extending from the helical protrusions 240. Thus, there may be at least a first lip 241a and second lip 241b disposed on the helical protrusion 240. In other embodiments, the second lip 241b may extend inward from the first lip 241a.

FIG. 5C shows the insulator with a top sheath 420. In this embodiment, the top sheath 420 does not begin at the first end 220. Rather, it only shields a top portion of the shaft. The top sheath 420 may begin at the midpoint of the shaft 200, or at a different location.

FIG. 5D shows the insulator with a top sheath 420 and a bottom sheath 430. In this embodiment, the bottom sheath 430 begins at the first end 220 and travels to a location near the midpoint of the shaft. The top sheath 420 begins at a location proximate the top of the bottom sheath 430. In this way, the bottom sheath 430 shields the bottom portion of the shaft, while the top sheath 420 only shields a top portion of the shaft. In another embodiment, the top sheath 420 may extend downward from the second end 230 toward the midpoint of the shaft, while the bottom sheath 430 begins at the first end 220 and travels to a location near the midpoint of the shaft FIG. 5E shows the insulator with a bottom sheath 430. In this embodiment, the bottom sheath 430 begins at the first end 220. However, it only shields a bottom portion of the shaft 200. The bottom sheath 430 may terminate at the midpoint of the shaft 200, or at a different location.

Although not shown, in other embodiments, the pitch and/or thickness of the helical protrusion 240 may change over the height of the insulator.

In all embodiments, the insulator 115 may be constructed from an insulating material. Suitable materials for use include aluminum oxide ($Al_2O_3$), zirconium oxide ($ZrO_3$), yttrium oxide ($YO_3$) or a combination of these. In some embodiments, resin bushings may be used. Due to the shape of the insulator, it may be preferable to construct the insulator using an additive manufacturing process, such as stereolithography. In addition to the ability to create the desired shapes, additive manufacturing also allows the insulator 115 to be constructed as one unitary component. In other words, the first end 220, the second end 230, the shaft 200, the helical protrusions 240 and the lip 241 are all a single component.

The embodiments described above in the present application may have many advantages. The insulator includes two features that improve its performance. First, the insulator includes a helical protrusion that spirals around the shaft from the first end to the second end. This helical protrusion serves to increase the insulator's tracking length, which is a function of the pitch of the helical protrusion, and the width of the insulator. The greater the tracking length of an insulator, the more deposition needed to coat the insulator and cause it to fail. Because the helical design increases the tracking length over that of a standard insulator design, it will take longer for the insulator to be coated and fail, increasing both the lifetime of the insulator and the running time of the overall ion implantation system.

Second, the helical protrusion includes a lip. This lip further increases the tracking length and limits deposition's line of sight, creating shielded surfaces where ions and material are not likely to reach. The lip allows for the control over the angle at which deposition enters the shielded area. By minimizing this incident angle, the likelihood of deposition rebounding and redepositing deeper in the shielded area is greatly minimized. This reduces the possibility of a conductive path.

Figure 8:
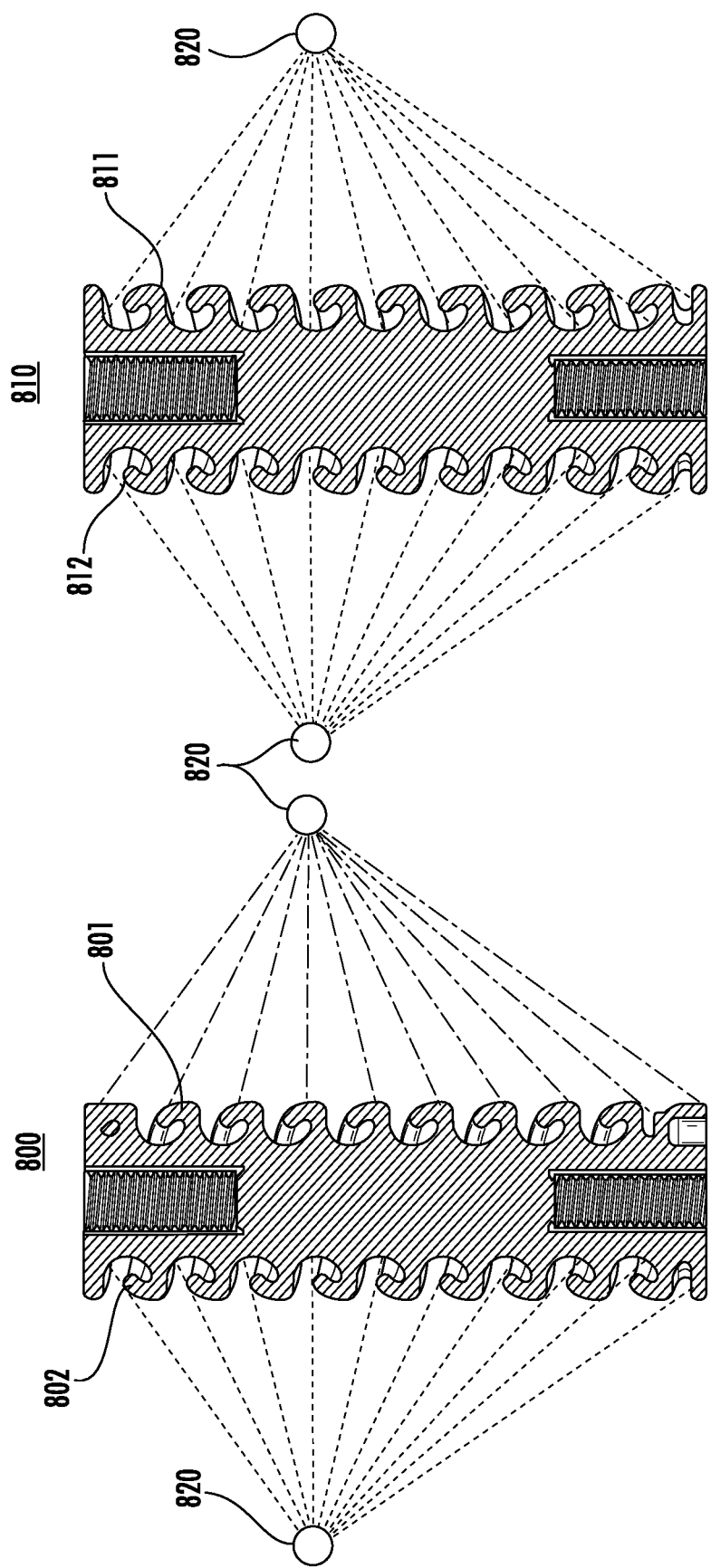
FIG. 8 shows the benefits of a helical protrusion with a lip as compared to only a lip.

Additionally, the combination of the helical protrusion and the lip has additional benefits. FIG. 8 shows a comparison of an improved insulator 800, having a helical protrusion 801 with a lip 802 on the left and an insulator 810 having concentric rings 811, each with a lip 812 on the right. By disposing the lip 802 on a helical protrusion 801, the lip 802 is continuous. In this way, temperature variation along the lip 802 may be reduced, especially as compared to the insulator 810 on the right that utilizes lips 812 on concentric rings 811. Second, in the event that there are one or more point sources 820 of material for deposition, the insulator 810 having concentric rings 811 on the right will experience the same deposition pattern around the perimeter. However, with a helical protrusion 801 shown on the left, the deposition pattern on the improved insulator 800 varies as the helical protrusion 801 spirals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An insulator, comprising:
   a shaft having a first end and a second end; and
   a helical protrusion spiraling around the shaft, wherein the helical protrusion comprises a lip disposed at its distal end extending toward the second end.

2. The insulator of claim 1, wherein the helical protrusion extends from the first end to the second end.

3. The insulator of claim 1, wherein the helical protrusion extends from the first end toward the second end.

4. The insulator of claim 3, wherein an indentation is disposed between the helical protrusion and the second end.

5. The insulator of claim 1, wherein an indentation is disposed between the first end and the helical protrusion and between the second end and the helical protrusion.

6. The insulator of claim 1, wherein a helical recess is disposed between adjacent threads of the helical protrusion, and wherein a portion of the helical recess is shielded by the lip.

7. The insulator of claim 1, wherein pitch is defined as a distance between two adjacent threads of the helical protrusion, and wherein the pitch comprises two portions, a total lip height defined as a distance from a bottom of a thread of the helical protrusion to a top of the lip, and an open height defined as a distance from the top of the lip to a bottom of an adjacent thread, and wherein a ratio of the total lip height to the open height is between 0.75 and 10.

8. The insulator of claim 7, wherein the ratio of the total lip height to the open height is between 2.5 and 10.

9. The insulator of claim 7, wherein the open height is between 0.02 and 0.5 inches.

10. The insulator of claim 1, wherein a width of the shaft varies over its length.

11. The insulator of claim 1, further comprising a second lip extending inward from the lip.

12. An ion implantation system comprising:
    an ion source;
    at least two electrodes disposed outside the ion source; and
    the insulator of claim 1, disposed between the at least two electrodes to physically and electrically separate the at least two electrodes from each other.

13. An insulator, comprising:
    a shaft having a first end and a second end;
    a helical protrusion spiraling around the shaft; and
    a sheath extending outward from the shaft and surrounding a portion of the shaft, wherein a sheath helical protrusion is disposed on an interior surface of the sheath facing the shaft; wherein at least one of the helical protrusion or the sheath helical protrusion comprises a lip disposed at its distal end.

14. The insulator of claim 13, wherein the lip extends toward an opening between the sheath and the shaft.

15. The insulator of claim 13, wherein the lip extends away from an opening between the sheath and the shaft.

16. The insulator of claim 13, wherein a lip is disposed on both the helical protrusion and the sheath helical protrusion.

17. The insulator of claim 16, wherein the lip disposed on the helical protrusion and the lip disposed on the sheath helical protrusion extend in a same direction.

18. The insulator of claim 13, further comprising a second sheath extending outward from the shaft and covering a second portion of the shaft.

19. An ion implantation system comprising:
    an ion source;
    at least two electrodes disposed outside the ion source; and
    the insulator of claim 13, disposed between the at least two electrodes to physically and electrically separate the at least two electrodes from each other.

* * * * *